United States Patent [19]

Hongu et al.

[11] 4,156,255

[45] May 22, 1979

[54] TELEVISION RECEIVER WITH SYNCHRONOUS DETECTION AND AUTOMATIC FINE TUNING

[75] Inventors: Masayuki Hongu, Komae; Hiromi Kawakami, Yokohama; Masaharu Tokuhara, Tokyo, all of Japan

[73] Assignee: Sony Corporation, Tokyo, Japan

[21] Appl. No.: 833,710

[22] Filed: Sep. 15, 1977

[30] Foreign Application Priority Data

Sep. 16, 1976 [JP] Japan .................................. 51-111109

[51] Int. Cl.$^2$ ............................................. H04N 5/50
[52] U.S. Cl. ....................................... 358/195; 325/420
[58] Field of Search ................ 358/195, 188; 325/420, 325/421

[56] References Cited

U.S. PATENT DOCUMENTS 3,946,148    3/1976    Skerlos ............................. 325/421 X Primary Examiner—Robert L. Richardson
Attorney, Agent, or Firm—Lewis H. Eslinger; Alvin Sinderbrand

[57] ABSTRACT

A television receiver has an automatic fine tuning circuit with a first phase-locked loop including a first low pass filter and a synchronous video detector with a second phase-locked loop including a second low pass filter. The cut off frequency of the first low pass filter is selected lower than the cut-off frequency of the second low pass filter, thereby enabling a stable operation of two phase-locked loops simultaneously.

9 Claims, 4 Drawing Figures

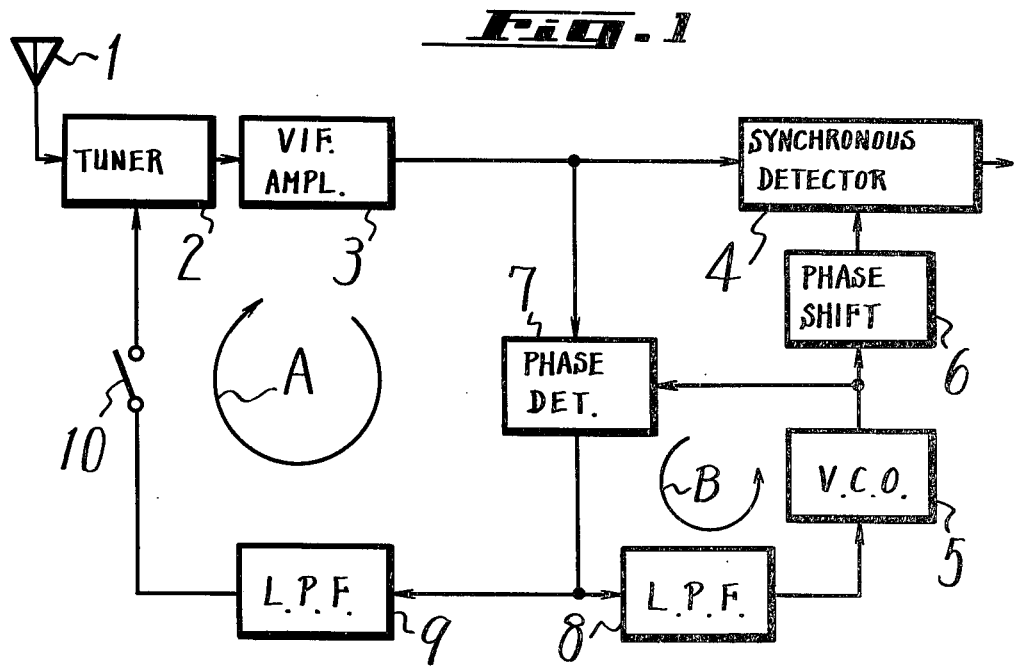
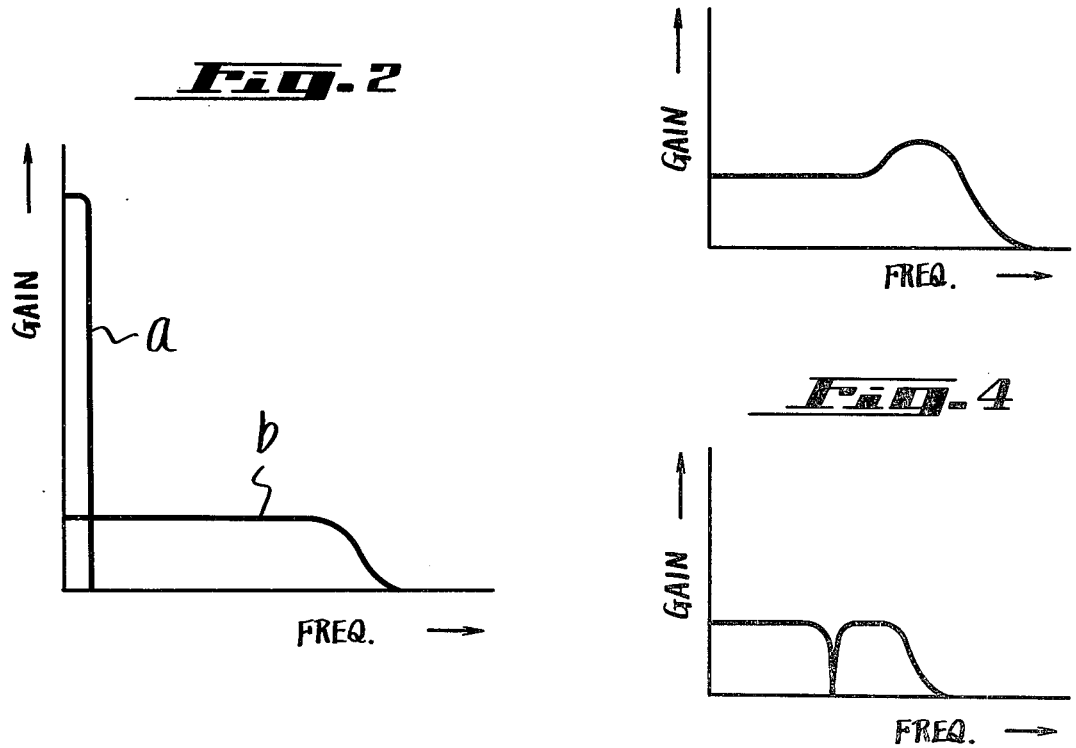

TELEVISION RECEIVER WITH SYNCHRONOUS DETECTION AND AUTOMATIC FINE TUNING

BACKGROUND OF THE INVENTION

1. Field of the Invention

This invention relates generally to a television receiver using a synchronous video detector, and more particular to a television receiver having an automatic fine tuning system with a phase-locked loop.

2. Description of the Prior Art

A television receiver having an automatic fine tuning system with a phase-locked loop and a synchronous video detector is known from U.S. Pat. No. 3,946,148 (Skerlos).

A television receiver described in the above-mentioned U.S. Patent includes a variable frequency reference oscillator supplying a reference signal to a phase detector for an automatic fine tuning operation and to synchronous detector for a video detection.

An output signal of the phase detector is supplied to a local oscillator for a tuner through a first low pass filter and to the reference oscillator through a second low pass filter.

However, in the above-mentioned U.S. Patent, it is neccesary to insert an AC coupling between the phase detector and the second low pass filter whenever a phase-locked loop for the automatic fine tuning is formed.

OBJECTS AND SUMMARY OF THE INVENTION

It is an object of this invention to provide an improved synchronous-detector type television receiver with a phase-locked loop type automatic fine tuning circuit.

Another object of this invention is to provide an improved synchronous video detecting system which can produce a normal video signal when the phase-locked loop for automatic fine tuning operation is opened.

According to an aspect of the present invention there is provided a detecting circuit for receiving an amplitude-modulated signal and providing a detected output, which comprises a tuner for converting an amplitude-modulated signal to an intermediate frequency signal, a circuit for supplying the intermediate frequency signal to a phase detector and to a synchronous detector, a variable frequency reference oscillator for supplying a reference signal to the phase detector and to the synchronous detector, a first low pass filter connected between said phase detector and the tuner, a second low pass filter connected between the phase detector and the reference oscillator, and an automatic fine tuning defeating circuit connected to said tuner the cut-off frequency of the first low pass filter is selected to be sufficiently lower than the cut-off frequency of the second low pass filter so that the detecting circuit can attain a braod capture range while both the AC and DC components of a phase error signal output of the phase detector are passed to the reference oscillator.

The other objects, features, and advantages of this invention will become apparent from the following description taken in conjunction with the accompanying drawings.

BRIEF DESCRIPTION OF THE DRAWINGS

FIG. 1 is a block diagram showing an example of the invention; and preferred embodiment of this FIGS. 2, 3, and 4 are graphs showing the characteristics of low pass filters which are suitable for use in the embodiment of the present invention shown in FIG. 1

DESCRIPTION OF THE PREFERRED EMBODIMENT

An example of the present invention will be hereinafter described with reference to the drawings.

FIG. 1 is a systematic block diagram showing an example of the invention. In FIG. 1, reference numeral 1 designates an antenna. A radio frequency signal received by the antenna 1 is fed to a tuner 2 from which a video intermediate frequency (VIF) signal is derived. The VIF signal from the tuner 2 is applied to a video intermediate frequency (VIF) amplifier 3, amplified thereby and then applied to a video detector 4 consisting of a synchronous detector. a voltage controlled oscillator (VCO) 5 produces a reference signal whose frequency is same as that of the VIF signal. The reference signal from the VCO 5 is applied through a phase shifter 6, which has the phase shifting amount of $\pi/2$, to the video detector 4. Thus, a video signal is detected by the synchronous detection. The VIF signal amplified by the VIF amplifier 3 is also applied to a phase detector 7 which is also supplied with the reference signal from the VCO 5, so that the phase detection is achieved with the reference signal from the VCO 5. The detected output signal from the phase detector 7 is fed to a low pass filter 8 which has a relatively high cut-off frequency shown by a curve b in the graph of FIG. 2 in which the ordinate represents the gain and the abscissa represents the frequency. The output voltage from the low pass filter 8 is applied to the VCO 5 to control the latter. The detected output signal from the phase detector 7 is further applied to a low pass filter 9 which has a relatively low cut-off frequency shown by a curve a in the graph of FIG. 2. The output voltage from the low pass filter 9 is fed through an automatic fine tuning (AFT) switch 10 to a local oscillator in the tuner 2 to control its local oscillation frequency.

In the above circuit construction, the AFT operation is carried out by a phase-locked loop or a so-called PLL which includes phase detector 7 and low pass filter 9 shown by a loop arrow A in FIG. 1. Thus, when the AFT switch 10 is closed or ON, the carrier of the VIF signal delivered from the VIF amplifier 3 i.e., the video intermediate carrier is so controlled by the PLL A that its frequency coincides with the frequency of the reference signal from the VCO 5 and its phase is shifted by just $\pi 2$ from that of the reference signal. Accordingly, in the video detector 4 the VIF signal is synchronously detected with the signal whose phase is same as that of the carrier of the VIF signal, so that the normal video detected output signal can be obtained.

In the present invention, there is further provided another phase-locked loop (PLL) including the phase detector 7, low pass filter 8 and VCO 5 indicated by a loop arrow B in FIG. 1 in addition to the PLL A for the AFt operation. This PLL B is provided so that even when the AFT switch 10 is opened or OFF, and the AFT operation is thereby inhibited, the video or synchronous detector 4 can detect the video signal normally.

With the above circuit construction, when the AFT switch 10 is made OFF the PLL A is opened. However, since the PLL B which transmits a DC component exists, the VCO 5 is so controlled by the PLL B that the phase of the signal from the VCO 5 is shifted by just 90/2 from the phase of the carrier of the VIF signal delivered from the VIF amplifier 3. Thus, the VIF signal is synchronously detected in the video detector 4 with the signal whose phase is same as the phase of the carrier of the VIF signal, and accordingly the normal video detected output signal is obtained even if the AFT switch 10 is made OFF.

In this case, in order to widen the capture range, the cut-off frequency of the low pass filter 8 of the PLL B is increased to a necessary high frequency, for example, about 2 MHz, and the cut-off frequency of low frequency pass filter 9 of PLL A is decreased to a sufficiently low, for example, about 5 to 6 Hz so that the oscillation frequency of the local oscillator in the tuner 2 is not affected by the vertical and horizontal synchronizing signal.

The circuit operation is now considered, by which when the frequency of the VIF signal from VIF amplifier 3 is fluctuated, the PLLs A and B become stable. Assuming that the loop gain of PLL A is taken as $G_A$, the loop gain of PLL B as $G_B$, the fluctuation of the local oscillation frequency as $\Delta f_L$, and the fluctuation of the oscillation frequency of VCO 5 which is captured at that time as $\Delta f_O$, respectively, the following relationship is established among them.

$$(\Delta f_L/\Delta f_0) \approx 1 + (G_A/G_B) \qquad (1)$$

Accordingly, for the same fluctuation of the local oscillation frequency, as the ratio $G_A/G_B$ becomes great the fluctuation of the oscillation frequency of VCO 5 becomes correspondingly small.

Therefore, with the example of the invention, the loop gain $G_B$ of PLL B is suppressed at the limit value necessary to maintain the capture range, while the loop gain $G_A$ of PLL A is selected sufficiently higher than the loop gain $G_B$ of PLL B, in terms of the Ac and DC signals passing through these loops. Thus, the fluctuation of the oscillation frequency of VCO 5 can be minimized and hence the VCO 5 can be approximately operated as the reference oscillator.

By way of example, if the cut-off frequency of low pass filter 9 is selected as 5 to 6 Hz, the cut-off frequency of low pass filter 8 as about 2 MHz, and the ratio $G_A/G_B$ as 10, it is possible that the capture range of AFT is + 1 MHz and the shift of the frequency of the VIF signal derived from the VIF amplifier 3 from the reference frequency drops to within 50 KHz.

In this case, even if the loop gain $G_A$ of PLL A is selected high, the cut-off frequency of low pass filter 9 in PLL A is sufficiently low as set forth above. Damping of frequency fluctuation in the VCO 5 can be easily carrier out and the stbility is not affected.

As the second low pass filter 8, while a low pass filter having the ordinary flat characteristic indicated by the curve b in the graph of FIG. 2 can be used a low pass filter having the peaking characteristic shown in the graph of FIG. 3 or the trap characteristic shown in the graph of FIG. 4 can be used instead.

According to the system of the invention described as above, even under the normal condition wherein the AFT switch 10 is made ON to achieve the AFT operation, there in no need to insert a DC-component blocking circuit between the phase detector 7 and VCO 5, so that there is also no need to provide a change-over switch in the PLL B.

Futher, in the invention the cut-off frequency of low pass filter 8 is selected relatively high and the cut-off frequency of low pass filter 9 is selected relatively low, so that the capture range can be widened without damaging the stability of tuner 2 and the VCO 5 can be used as a stable reference oscillator.

Still further, even in the case that the AFT switch 10 is made OFF for manual fine tuning, the PLL B still can be operates so that the normal detected video output signal can be derived from the video detector 4.

The above description is given on a single preferred embodiment of the present invention but it will be apparent that many modifications and variations could be effected by one skilled in the art without departing from the spirits or scope of the novel concepts of the present invention. Therefore, the scope of the invention should be determined by the appended claims.

We claim as our invention:

1. A circuit for receiving an AM signal comprising:
   tuner means including a local oscillator for converting said AM signal into an IF signal;
   phase detector means for providing a phase error signal containing AC and DC components in response to said IF signal;
   synchronous detector means for providing an output signal in response to said IF signal;
   means supplying said IF signal to said phase detector means and to said synchronous detector means;
   variable frequency reference oscillator means supplying a reference signal to said phase detector means and to said synchronous detector means;
   first low pass filter means connected between said phase detector means and said local oscillator of the tuner means and passing frequencies in a band ranging from DC to a first cut-off frequency for controlling said local oscillator; and
   second low pass filter means connected between said phase detector and said reference oscillator means and passing frequencies in a band ranging from DC to a second cut-off frequency;
   said first cut-off frequency being sufficiently less than said second cut-off frequency so that it is possible to affect automatic fine tuning for receiving said AM signal while both the AC and DC components of the phase error signal of said phase detector are permitted to pass to said reference oscillator means.

2. A circuit according to claim 1, wherein said first cut-off frequency is selected to be about 5–6 Hz, and said second cut off frequency is selected to be about 2MHz.

3. A circuit according to claim 1, wherein said tuner means, said phase detector means, and said first low pass filter means form a first phase-locked loop, and said reference oscillator means, said phase detector means, and said second low pass filter means form a second phase-locked loop, and the gain of said first phase-locked loop is selected to be greater than the gain of said second phase-locked loop.

4. A circuit according to claim 1, wherein said second low pass filter means has a transfer characteristic with a peak near said second cut-off frequency.

5. A circuit according to claim 1, wherein said second low pass filter means has a trap transfer characteristic.

6. A circuit according to claim 1, wherein said first cut-off frequency is selected as less than about 6Hz.

7. A circuit according to claim 1, wherein said first cut-off frequency is selected as greater than about 5 $H_z$.

8. A circuit according to claim 1, wherein said AM signal contains video signals having horizontal and vertical synchronizing signals therein, and said first cut-off frequency is selected at a value sufficiently below the frequency of said horizontal synchronizing signals and below the frequency of said vertical synchronizing signals, so that the horizontal and vertical synchronizing signals do not affect the operation of said tuner means.

9. A circuit according to claim 1, further comprising switch means between said first low pass filter means and said local oscillator of said tuner means for selectively inhibiting said automatic fine tuning.

* * * * *